(12) United States Patent
Naka et al.

(10) Patent No.: US 9,966,521 B2
(45) Date of Patent: May 8, 2018

(54) LIGHT EMITTING DEVICE

(71) Applicant: NICHIA CORPORATION, Anan-shi (JP)

(72) Inventors: Ryoji Naka, Tokushima (JP); Naofumi Sumitani, Itano-gun (JP)

(73) Assignee: NICHIA CORPORATION, Anan-shi (JP)

( * ) Notice: Subject to any disclaimer, the term of this patent is extended or adjusted under 35 U.S.C. 154(b) by 0 days. days.

(21) Appl. No.: 15/411,010

(22) Filed: Jan. 20, 2017

(65) Prior Publication Data

US 2017/0213944 A1  Jul. 27, 2017

(30) Foreign Application Priority Data

Jan. 22, 2016 (JP) ................. 2016-011141

(51) Int. Cl.
*H01L 33/62* (2010.01)
*H01L 33/60* (2010.01)
*H01L 33/48* (2010.01)

(52) U.S. Cl.
CPC .............. *H01L 33/62* (2013.01); *H01L 33/60* (2013.01); *H01L 33/486* (2013.01); *H01L 2224/27013* (2013.01); *H01L 2224/48247* (2013.01); *H01L 2224/48465* (2013.01); *H01L 2224/73265* (2013.01)

(58) Field of Classification Search
CPC ......... H01L 33/60; H01L 33/62; H01L 33/54; H01L 33/52; H01L 33/486; H01L 2224/27013; H01L 2224/48247; H01L 2224/48465; H01L 2224/73265

USPC ............................................... 257/98
See application file for complete search history.

(56) References Cited

U.S. PATENT DOCUMENTS

| 2008/0054287 A1* | 3/2008 | Oshio ..................... H01L 33/60 257/99 |
| 2013/0183787 A1* | 7/2013 | Inobe ..................... H01L 33/60 438/65 |
| 2015/0021640 A1* | 1/2015 | Oka ........................ H01L 24/48 257/98 |

(Continued)

FOREIGN PATENT DOCUMENTS

| JP | 2008-60344 | 3/2008 |
| JP | 2012-033724 | 2/2012 |
| JP | 2013-13814 | 7/2013 |

(Continued)

*Primary Examiner* — Chuong A Luu
(74) *Attorney, Agent, or Firm* — Mori & Ward, LLP

(57) ABSTRACT

A light emitting device includes a resin package having a recess defined by a recess bottom surface and a recess lateral surface. The resin package includes a first lead including a first lead lower surface, a first lead upper surface, and an end portion. The light emitting element is mounted on the first lead upper surface opposite to the first lead lower surface. The light reflecting member is disposed on the recess bottom surface between the recess lateral surface and the light emitting element in a lateral direction. The end portion is provided between the first lead lower surface and the light reflecting member in the lateral direction. The end portion has a cross-sectional area viewed in the lateral direction which is smaller than a cross-sectional area of the first lead between the first lead lower surface and the first lead upper surface viewed in the lateral direction.

18 Claims, 8 Drawing Sheets

(56) References Cited

U.S. PATENT DOCUMENTS

2015/0084177 A1\* 3/2015 Oda .................. H01L 24/97
                                                                                    257/676
2016/0276252 A1     9/2016 Yoshimoto et al.

FOREIGN PATENT DOCUMENTS

| JP | 2014-165262 | 9/2014 |
| JP | 2014-183134 | 9/2014 |
| JP | 2015-225942 | 12/2015 |

\* cited by examiner

LIGHT EMITTING DEVICE

CROSS-REFERENCE TO RELATED APPLICATIONS

The present application claims priority under 35 U.S.C. § 119 to Japanese Patent Application No. 2016-011141 filed on Jan. 22, 2016, entitled "Light emitting device". The contents of this application are incorporated herein by reference in their entirety.

BACKGROUND

1. Technical Field

The present disclosure relates to a light emitting device.

2. Description of Related Art

With a light emitting device using a light emitting element such as an LED, high light emission efficiency can be easily obtained. Accordingly, they are used for various devices including a backlight device for a display or the like and an illuminating device.

In each of JP 2014-165262 A and JP 2014-183134 A, a light emitting device is disclosed in which a light emitting element is mounted on a resin package including a lead frame and resin.

Further, in JP 2008-60344 A, a light emitting device is disclosed in which a light emitting element is mounted inside a recess defined in a package, and a light-reflecting resin member is disposed near the light emitting element.

SUMMARY

A light emitting device according to the present disclosure includes a resin package, a light emitting element, and a light reflecting member. The resin package has a package bottom surface and a package top surface opposite to the package bottom surface in a height direction of the resin package. The resin package having a recess hollowed from the package top surface in the height direction. The recess is defined by a recess bottom surface and a recess lateral surface. The resin package includes a first lead and a main body. The first lead is provided on the recess bottom surface. The first lead includes a first lead lower surface, a first lead upper surface, and an end portion. The first lead lower surface is opposite to the recess bottom surface in the height direction. The first lead upper surface constitutes a first part of the recess bottom surface. The end portion connects the first lead lower surface and the first load upper surface. The main body supports the first lead. The light emitting element is mounted on the first lead upper surface opposite to the first lead lower surface. The light reflecting member is disposed on the recess bottom surface between the recess lateral surface and the light emitting element in a lateral direction perpendicular to the height direction. The end portion is provided between the first lead lower surface and the light reflecting member in the lateral direction. The end portion has a cross-sectional area viewed in the lateral direction which is smaller than a cross-sectional area of the first lead between the first lead lower surface and the first lead upper surface viewed in the lateral direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EMBODIMENTS

Figure 1A:
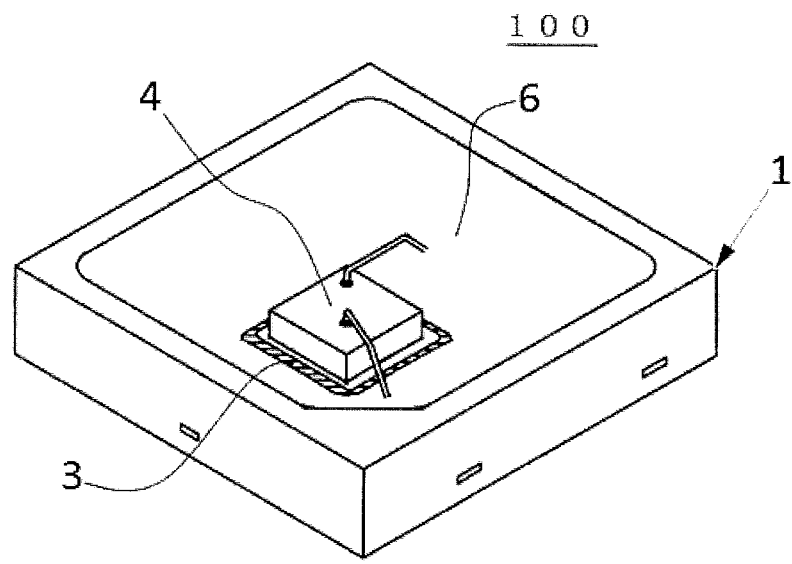
FIG. 1A is a schematic perspective view of a light emitting device 100 according to a first embodiment of the present disclosure.

The embodiments will now be described with reference to the accompanying drawings, wherein like reference numerals designate corresponding or identical elements throughout the various drawings.

In the description below, certain embodiments of the present disclosure is illustrated with reference to the drawings. The embodiments described below are intended as illustrative to give a concrete faint to technical idea of the present disclosure, and thus technical scope of the present disclosure shall not be limited to those described below. Configurations described in one embodiment can also be applied to another embodiment unless otherwise specified. In the description below, the terms that indicates specific directions or positions (for example, "upper/top", "lower/bottom", "right", "left", and other terms including these terms) are used as necessary, but these terms are used for easy understanding of embodiments of the invention with reference to the drawings, and thus the technical scope of the disclosure shall not be limited by the meaning of those terms.

The size, positional relationship and the like of members shown in each drawing may be exaggerated for the sake of clarity. Further, the same numerals in different drawings indicate the same or similar portions or members.

The light emitting device according to the present disclosure includes a resin package including a recess defined by lateral surfaces (a recess lateral surface) and a bottom surface (a recess bottom surface) and a groove in the bottom surface of the recess, a light emitting element, and a light reflecting member disposed inside the recess.

The resin package includes: a first lead having a lower surface (a first lead lower surface) and a recessed surface continuous to the lower surface; a second lead disposed opposing the first lead; and a molded body (a main body) formed with the first lead and the second lead as a single body. The light emitting element is mounted on an upper surface (a first lead upper surface) of the first lead. The groove is formed in the upper surface of the first lead at the bottom surface of the recess. Further, the light reflecting member is formed between the lateral surfaces of the recess and the groove. Further, the recessed surface of the first lead is positioned at an end portion of the first lead on a second lead side. In a cross-sectional view, an outer upper edge of the groove is positioned closer to the end portion of the first lead than a boundary between the lower surface and the recessed surface is to the end portion of the first lead.

As compared to a light emitting device with no groove, in the light emitting device of the present disclosure having the above-described structure, a path for dissipating heat from the light emitting element toward an end portion of the first lead can be increased. Further, the width of a portion through which the heat is transferred can be reduced. Accordingly, the heat less easily transfers toward an end portion of the first lead. This can prevent expansion of the light reflecting member positioned on an end portion side of the first lead due to heat from the light emitting element, so that creeping up of the light reflecting member near the light emitting element can be reduced. As a result, a light emitting device with high reliability can be provided. Further, a light emitting device with good light extraction efficiency can be obtained.

In the description below, a detailed description will be given of the light emitting device according to embodiments of the present invention.

1. First Embodiment

FIG. 1A is a schematic perspective view showing a light emitting device 100.

Figure 1B:
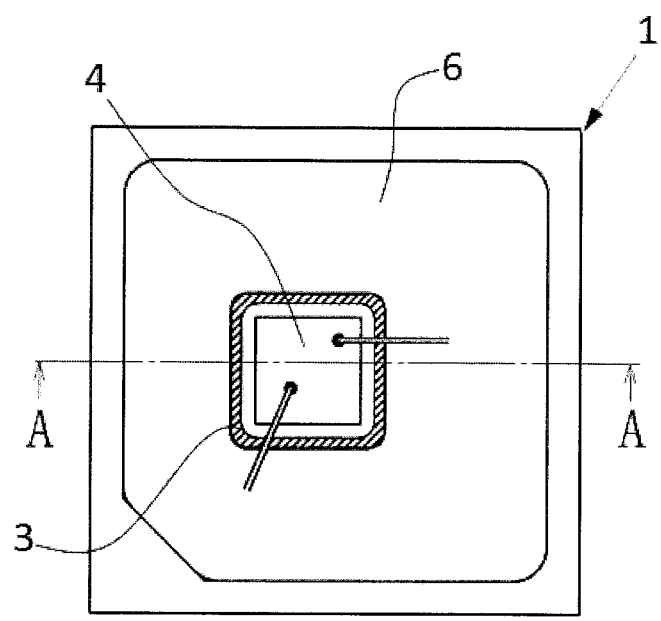
FIG. 1B is a schematic top view of the light emitting device 100 according to the first embodiment of the present disclosure.
Figure 1C:
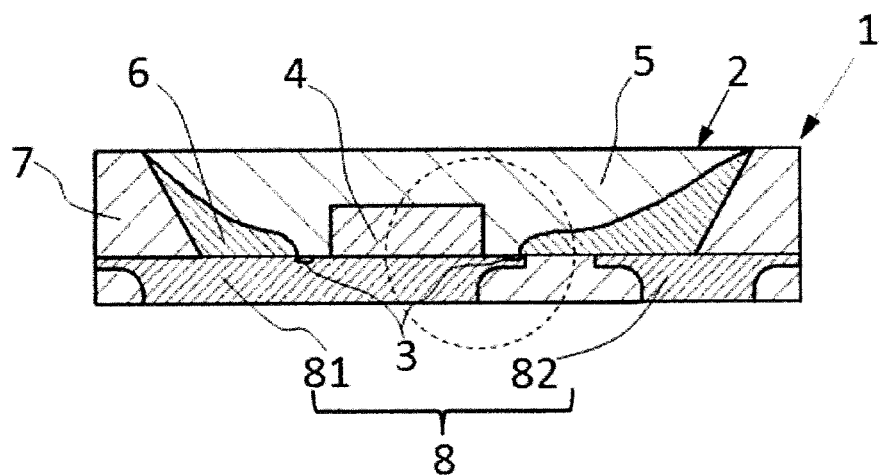
FIG. 1C is a schematic cross-sectional view taken along line A-A in FIG. 1B.
Figure 1D:
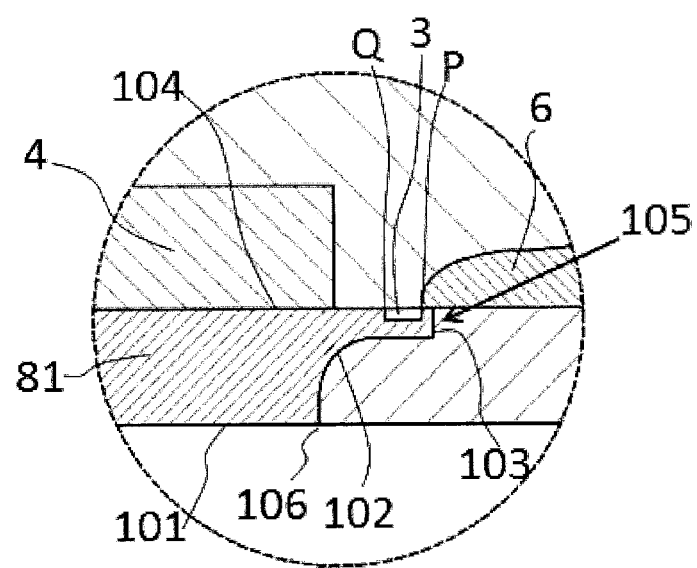
FIG. 1D is an enlarged view of a portion surrounded by a broken line in FIG. 1C.

FIG. 1B is a schematic top view showing the light emitting device 100 according to a first embodiment of the present disclosure. FIG. 1C is a schematic cross-sectional view taken along line A-A in FIG. 1B. FIG. 1D is an enlarged view of a portion surrounded by a broken line in FIG. 1C.

The light emitting device 100 includes a resin package 1 including a recess 2 defined by lateral surfaces (a recess lateral surface) and a bottom surface (a recess bottom surface) and a groove 3 in the bottom surface of the recess 2, a light emitting element 4 disposed on the bottom surface of the recess 2, and a light reflecting member 6 formed continuously between the lateral surfaces of the recess 2 and the groove 3. The light emitting device 100 shown in FIGS. 1A, 1B, and 1C further includes a light-transmissive member 5 inside the recess 2. The lateral surfaces of the recess 2 refer to inner lateral surfaces of the recess 2.

Resin Package

The resin package 1 of the light emitting device 100 includes a molded body 7 (a main body 7), and a first lead 81 and a second lead 82 which are formed with the molded body 7 as a single body. The resin package 1 includes the recess 2, and a portion of each of the first lead 81 and the second lead 82 is disposed in the bottom surface of the recess 2.

First Lead

The first lead 81 includes a lower surface 101 (a first lead lower surface 101), and a recessed surface 102 continuous to the lower surface 101. In the light emitting device 100 shown in FIG. 1D, the first lead 81 includes the lower surface 101, the recessed surface 102 continuous to the lower surface 101, a lateral surface 103 continuous to the recessed surface 102 and substantially perpendicular to the lower surface 101 of the first lead 81, and an upper surface 104 (a first lead upper surface 104) continuous to the lateral surface 103 and substantially in parallel to the lower surface 101. The recessed surface 102 of the first lead 81 is positioned at an end portion 105 of the first lead 81 on the second lead 82 side. The expression "end portion 105 of the first lead 81 on the second lead 82 side" refers to an outer edge of the first lead 81 located on the second lead 82 side.

In the light emitting device 100 shown in FIG. 1D, the recessed surface 102 and the lateral surfaces 103 of the first lead 81 are covered with the molded body 7, which will be described later. With the first lead 81 having the recessed surface 102, the contact area between the first lead 81 and the molded body 7 is increased, so that adhesion between the first lead 81 and the molded body 7 can be increased.

Second Lead

The second lead 82 is disposed to face the first lead 81. The expression "the second lead 82 and the first lead 81 face each other" refers to not only the case where one lateral surface of the second lead 82 faces one lateral surface of the first lead 81 entirely, but also the case where at least a portion of a lateral surface of the second lead 82 faces at least a portion of a lateral surface of the first lead 81. Further, as shown in FIG. 1C, the second lead 82 may also include a recessed surface 102 similarly to the first lead 81. With this, adhesion between a plurality of leads 8 and the molded body 7 can be increased.

Groove

The groove 3 is formed in the upper surface of the first lead 81 at the bottom surface of the recess 2, so as to surround an element mounting region X. The groove 3 has an outer upper edge P and an inner upper edge Q. As shown in FIG. 1D, of two edges (i.e., upper edges) opposing to each other in a width direction at the top of the groove 3, the outer upper edge P is one edge farther from the element mounting region X, and the inner upper edge Q is the other edge closer to the element mounting region X. In the light emitting device 100 according to the first embodiment, the resin package 1 may be manufactured using the first lead 81 in which the groove 3 has been formed. Alternatively, the groove 3 may be formed after the resin package 1 is formed.

Figure 2A:
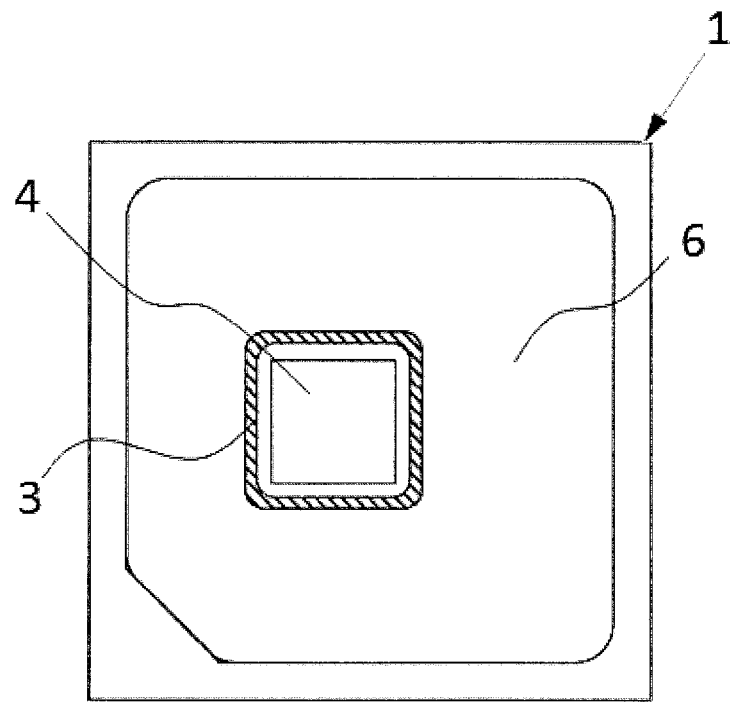
FIG. 2A is a schematic top view showing the light emitting device 100 according to the first embodiment of the present disclosure.
Figure 2B:
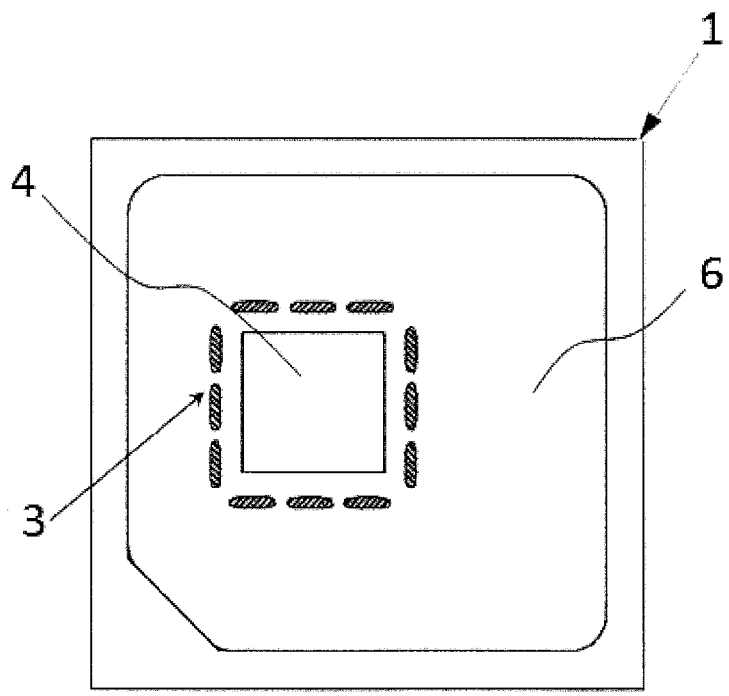
FIG. 2B is a schematic top view showing the light emitting device 100 according to the first embodiment of the present disclosure.

The groove 3 is formed at an inner side than the lateral surfaces (a recess lateral surface) of the recess 2 of the resin package 1, and serves as a stopper that prevents the light reflecting member from reaching the lateral surfaces of the light emitting element 4. Accordingly, the groove 3 can be disposed between the region where the light reflecting member 6 is formed and the light emitting element 4. For example, when the light reflecting member 6 is formed surrounding the all peripheral sides of the light emitting element 4, the groove 3 is disposed surrounding all peripheral sides of the light emitting element 4. In this case, the groove 3 may be one continuous groove as shown in FIG. 2A, or may be a plurality of grooves which are intermittently formed. Alternatively, as shown in FIG. 2B, the groove 3 may be a plurality of groove-like recesses spaced apart from each other. The distance between the recesses is selected to be small so that the light reflecting member 6 may partially enter the element mounting region X but does not cover the lateral surfaces of the light emitting element 4. The distance between the recesses is, for example, 1 μm to 100 μm, and preferably 10 μm to 50 μm. In any of these cases, the groove 3 is disposed surrounding all peripheral sides of the light emitting element 4, in other words, in the region corresponding to all sides of the light emitting element 4.

Figure 2C:
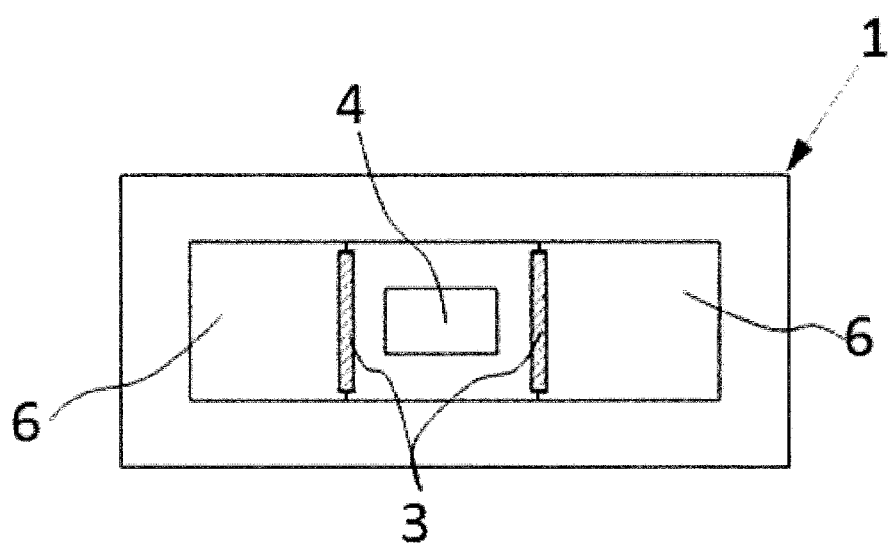
FIG. 2C is a schematic top view showing the light emitting device 100 according to the first embodiment of the present disclosure.

Alternatively, as shown in FIG. 2C, when the light reflecting member 6 is not disposed surrounding the entire periphery of the light emitting element 4, but is disposed partially surrounding the periphery of the light emitting element 4, for example, when the light reflecting member 6 is disposed corresponding to one to three peripheral sides of the light emitting element 4 having a quadrilateral shape in a plan view, the light reflecting member 6 is arranged corresponding to the one to three peripheral sides of the light emitting element 4. In other words, between the light emitting element 4 and the lateral surfaces of the recess 2, the groove 3 is absent in one to three regions of four regions corresponding to the four peripheral sides of the quadrilateral light emitting element 4 in a plan view. The groove 3 that does not surround the entire periphery of the light emitting element 4 may have a shape such as a linear shape, a curved shape, or combination of these shapes. Further, the groove 3 that does not surround the entire periphery of the light emitting element 4 may be spaced apart from the lateral surfaces of the recess 2. If the groove 3 reached the lateral surfaces of the recess 2, the molded body 7 may enter the groove 3 during molding of the molded body 7, so that the groove 3 may be filled with the molded body 7. In the state where the groove 3 is filled with the molded body 7, the light reflecting member 6 may not be stopped by the groove 3. Accordingly, the groove 3 is disposed to be spaced apart from the lateral surfaces of the recess 2 so as to prevent the groove 3 from being filled.

As described above, the groove 3 may be formed surrounding all peripheral sides of the light emitting element 4 or part of the peripheral sides of the light emitting element 4. Both arrangements are referred to as "surrounding the light emitting element".

As shown in FIG. 1D, the outer upper edge P of the groove is positioned closer to the end portion 105 than a boundary 106 between the lower surface 101 and the recessed surface 102 to the end portion 105. With this arrangement, as compared to the case where no groove 3 is provided, the path for dissipating heat from the light emitting element 4 toward the end 105 of the first lead 81 can be increased. Further, the width of the path through which the heat is transferred is reduced. Accordingly, heat is not easily transferred toward the end portion 105 of the first lead 81. With this arrangement, expansion of the light reflecting member 6 located on the end portion 105 side of the first lead 81 due to heat from the light emitting element 4 can be prevented, and thus creeping up of the light reflecting member 6 near the light emitting element 4 can be prevented.

The groove 3 is preferably located higher than the boundary 106 in a cross-sectional view. In this case, the groove 3 is preferably formed such that the distance on a plane between a first plane, which passes through the outer upper edge P and is perpendicular to the upper surface 104 of the first lead 81, and a second plane, which passes through the boundary 106 and is perpendicular to the upper surface 104 of the first lead 81, is preferably in a range of 1 μm to 100 μm, and further preferably in a range of 10 μm to 30 μm. With this, the groove 3 is formed in the first lead 81 at a portion with a relatively great thickness in the region above the recessed surface 102. With this arrangement, expansion of the light reflecting member 6 can be reduced, while preventing decrease in strength of the resin package 1.

The groove 3 may have any appropriate shape. For example, in a plan view, the groove 3 may have a quadrangular, rectangular, polygonal, circular, or elliptical shape, or a shape of a combination of these.

In the description below, with reference to FIGS. 3A to 3D, preferable shapes of the groove 3 are exemplarily shown.

Figure 3A:
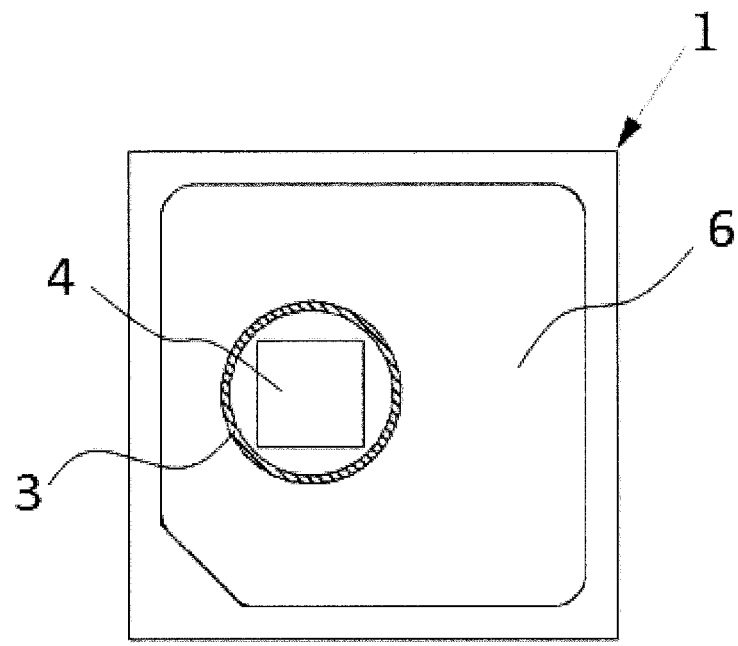
FIG. 3A is a schematic top view showing the light emitting device 100 according to the first embodiment of the present disclosure.

When the groove 3 has a circular outer peripheral shape of in a plan view, as shown in FIG. 3A, the light reflecting member 6 disposed around the groove 3 has a circular inner shape. With such a light reflecting member 6 having no corner portions, light components attenuated emitted from the light emitting element 4 can be prevented from being attenuated at the corner portions. Accordingly, a light emitting device with high light extraction efficiency can be obtained. Further, in a plan view, the light emitting element 4 in this case preferably has a shape closer to a circular shape such as a hexagonal shape corresponding to the circular shape of the groove 3. With the light emitting element 4 having such a shape, the light emitting element 4 having a relatively large size with respect to the area of the element-mounting region X can be used, so that light extraction efficiency can be improved.

Figure 3B:
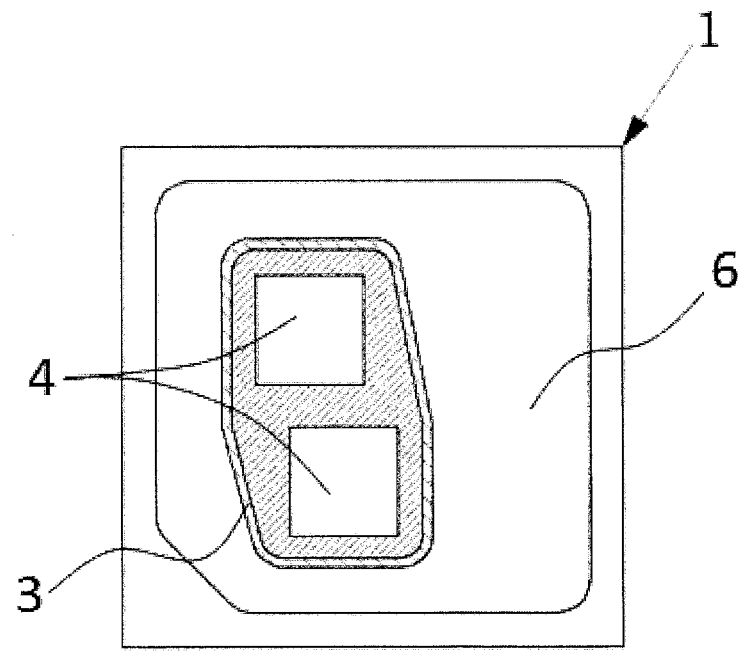
FIG. 3B is a schematic top view showing the light emitting device 100 according to the first embodiment of the present disclosure.

Further, as shown in FIG. 3B, in the case where a plurality of light emitting elements 4 is mounted on the element mounting region X, the light emitting elements 4 are preferably disposed offset from each other in a top-bottom direction or in a right-left direction in a plan view. With this arrangement, absorption of light emitted in a direction toward lateral surfaces of the light emitting element 3 from one light emitting element 3 by adjacent light emitting element 3 can be reduced. In this case, provided that a length of a long side of the light emitting element 4 in a plan view (e.g., the length of one side in the case where the light emitting element 4 has a square shape in a plan view) is represented by L, a planar distance between a lateral surface of one light emitting element and a lateral surface of the adjacent light emitting element on the same side is preferably greater than L/10, further preferably greater than L/3, and particularly preferably greater than L.

Figure 3C:
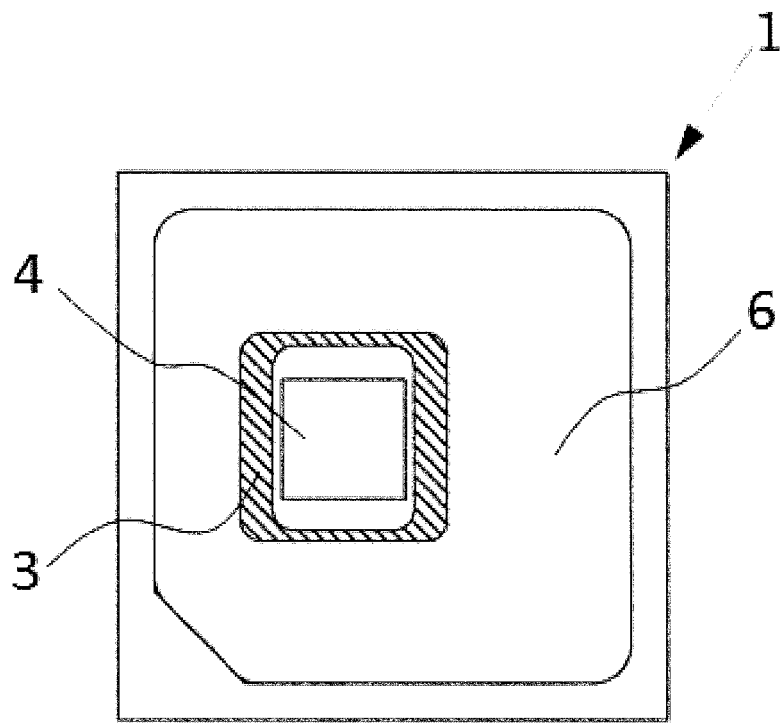
FIG. 3C is a schematic top view showing the light emitting device 100 according to the first embodiment of the present disclosure.

Further, as shown in FIG. 3C, the groove 3 may have a varied width in a plan view. In other words, the groove 3 may partially have a width greater than that of other portions of the groove 3. With such a shape, distribution in number of phosphors disposed on the first resin member 4 can be varied, so that light distribution can be controlled so as to, for example, increase color temperature of light in an intended direction. In this case, the groove 3 preferably has the maximum width of is 1.5 times as large as the minimum width thereof or greater. In FIG. 3C, in a top view, the groove 3 has the maximum width at portions extending in the right-left direction of the light emitting element 4, and has the minimum value at portions extending in the top-bottom direction of the light emitting element 4.

Figure 3D:
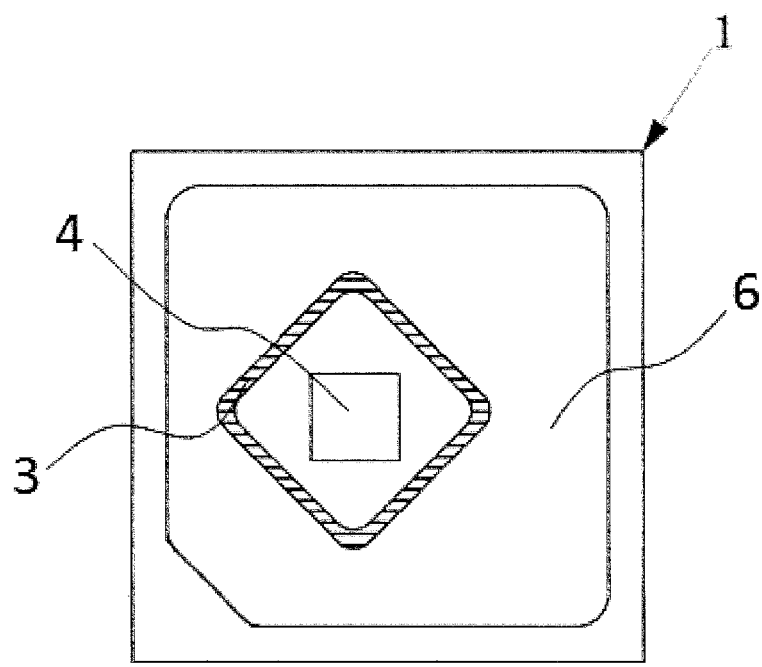
FIG. 3D is a schematic top view showing the light emitting device 100 according to the first embodiment of the present disclosure.

Further, as shown in FIG. 3D, the distance between each of the lateral surfaces of the light emitting element 4 and the groove 3 may not be uniform and may be varied. In the light emitting device 100 shown in FIG. 3D, each of the corners of the light emitting element 4 having substantially quadrangular outer shape in a plan view faces respective periphery of the groove 3. Such an arrangement, for example, allows for varying the distance between each of the lateral surfaces of the light emitting element 4 and the groove 3. With this, the distance between the light emitting element 4 and the light reflecting member 6 can be increased or reduced in any direction, which allows for controlling light distribution of the light emitting device itself as desired.

The groove 3 can be formed by subjecting a lead frame (a metal plate before singulated into the pair of leads 8) to press processing or etching processing. Alternatively, other methods normally employed for processing on lead frames, such as laser light irradiation, cutting, blasting and the like can be employed.

The groove 3 may be formed simultaneously with processing of a lead frame into the plurality of leads 8 each having a predetermined shape. Alternatively, the groove 3 may be formed in a different step after the plurality of leads 8 is obtained from a lead frame.

The upper surface 104 of the first lead 81 at the bottom surface of the recess 2 has a region for mounting the light emitting element 4 thereon (hereinafter referred to as an "element mounting region X"). The element mounting region X is demarcated by the groove 3.

The element mounting region X has a shape corresponding to the outermost periphery of the light emitting element 4 to be disposed thereon, and corresponding to the planar shape of the light emitting element 4. That is, the element mounting region X has an outer shape corresponding to or substantially corresponding to the outer peripheral shape of the light emitting element 4 disposed thereon (for example, with the difference in area of ±10% or smaller).

The number of the light emitting element 4 disposed on one element mounting region X may be one, or may be two or more. In the case where two or more light emitting elements 4 are disposed, the overall outer shape of the disposed two or more light emitting elements 4 can be regarded as the above-described outer peripheral shape of the light emitting element 4. Further, a plurality of element mounting regions X may be provided. In this case, one or two or more light emitting elements 4 are disposed for each element mounting region X.

The planar dimension of the element mounting region X can be determined as appropriate depending on the plane area, the number, arrangement, or the like of the light emitting element 4 to be disposed thereon. When a single light emitting element 4 is employed, for example, the planar dimension of the element mounting region X is preferably 1.2 to 2 times, more preferably 1.5 to 1.8 times as large as the planar dimension of the light emitting element 4.

The first lead 81 and the second lead 82 are each made of an electrically conductive material. Note that, while the first lead 81 normally functions as an electrode, the first lead 81 may not function as an electrode. For example, the first lead 81 may be a heat dissipating member. Further, in addition to the first lead 81 and the second lead 82, other metal plate may be provided.

The first lead 81 and the second lead 82 each includes a base member and a plating layer that covers the base member.

For the base member, a metal such as copper, aluminum, gold, silver, tungsten, iron, nickel, cobalt, or molybdenum, alloy of these metals, phosphor bronze, or copper-iron alloy can be employed. The base member may be a single layer, or may have a layered structure (for example, a cladding member).

Examples of the material of the plating layer include silver, aluminum, nickel, palladium, rhodium, gold, copper, or alloy of the foregoing metals.

In the case where a silver plating layer is disposed on a surface of each of the first lead 81 and the second lead 82, a protective layer made of silicon oxide or the like may be disposed on a surface of the silver plating layer. With the protective layer covering the surface of the silver plating layer, the silver plating layer is prevented from discoloring due to sulfur components or the like in the air. The protective layer can be formed by, for example, vacuum processing such as sputtering, or any other known method.

The first lead 81 and the second lead 82 may each have a thickness of, for example, about 100 µm to 1000 µm.

Molded Body

The molded body 7 fixes the first lead 81 and the second lead 82. For a resin used for the base material of the molded body 7, thermosetting resin or thermoplastic resin can be used. More specific examples of the molded body 7 include an epoxy resin composition, a silicone resin composition, a modified epoxy resin composition such as silicone-modified epoxy resin, a modified silicone resin composition such as epoxy-modified silicone resin, unsaturated polyester resin, a polyimide resin composition, a modified polyimide resin composition, polyphthalamide (PPA), polycarbonate resin, polyphenylenesulfide (PPS), liquid crystal polymer (LCP), ABS resin, phenolic resin, acrylic resin, PBT resin and the like. In particular, thermosetting resin is preferable.

The molded body 7 preferably contains a light reflecting substance. For the light reflecting substance, titanium oxide, silicon oxide, zirconium oxide, potassium titanate, aluminum oxide, zinc oxide, aluminum nitride, boron nitride, mullite, etc., can be employed. With this, light from the light emitting element 4 can be efficiently reflected. For example, when titanium oxide is employed, titanium oxide is preferably contained 20 percent by weight to 60 percent by weight, and further preferably 25 percent by weight to 55 percent by weight, with respect to the total weight of the resin employed as the base material. The molded body 7 preferably has a reflectivity of 60% or greater, and more preferably 90% or greater, with respect to light from the light emitting element 4.

Further, in order to enhance contrast of the light emitting device, the molded body 7 may have low light reflectivity with respect to external light from outside the light emitting device (in many cases, sunlight). In this case, normally the molded body 7 is preferably black or a color similar to black. In this case, a filler, which may be selected from, in accordance with the intended use, carbon such as acetylene black, activated carbon, graphite and the like, transition metal oxide such as iron oxide, manganese dioxide, cobalt oxide, molybdenum oxide and the like, or colored organic pigment and the like, can be used.

Light Reflecting Member

The light reflecting member 6 is formed at the bottom surface between the lateral surfaces of the recess 2 and the groove 3. The light reflecting member 6 serves to direct light emitted from the light emitting element 4 toward the opening of the recess 2.

The light reflecting member 6 may be, for example as shown in FIG. 1C, formed to be continuous as a whole between the lateral surfaces of the recess 2 and the groove 3. Alternatively, as shown in FIG. 2C, a plurality of light reflecting members 6 may be separately formed.

The light emitting device shown in FIG. 2C includes two grooves 3 and two light reflecting members 6. More specifically, in a top view, the light emitting device shown in FIG. 2C has a substantially quadrangular outer shape having a long-side direction and a short-side direction being perpendicular to the long-side direction. The two grooves 3 extend in the short-side direction so that two lateral surfaces of the light emitting element 4 are interposed between them. In this arrangement, the two grooves 3 are disposed near the light emitting element 4, and formed to be spaced apart from the lateral surfaces of the light emitting element 4. The two light reflecting members 6 are disposed between each two lateral surfaces at the longitudinal ends of the recess 2 and its corresponding groove 3. In such a light emitting device, an amount of resin used for the light reflecting member 6 can be reduced, so that an inexpensive light emitting device can be obtained. In the description above, the light emitting device having a substantially rectangular outer shape in a top view is illustrated as an example, while the light emitting device may have any appropriate shape. For example, a light emitting device having substantially square outer shape in a top view may have a structure similar to that.

Figure 4:
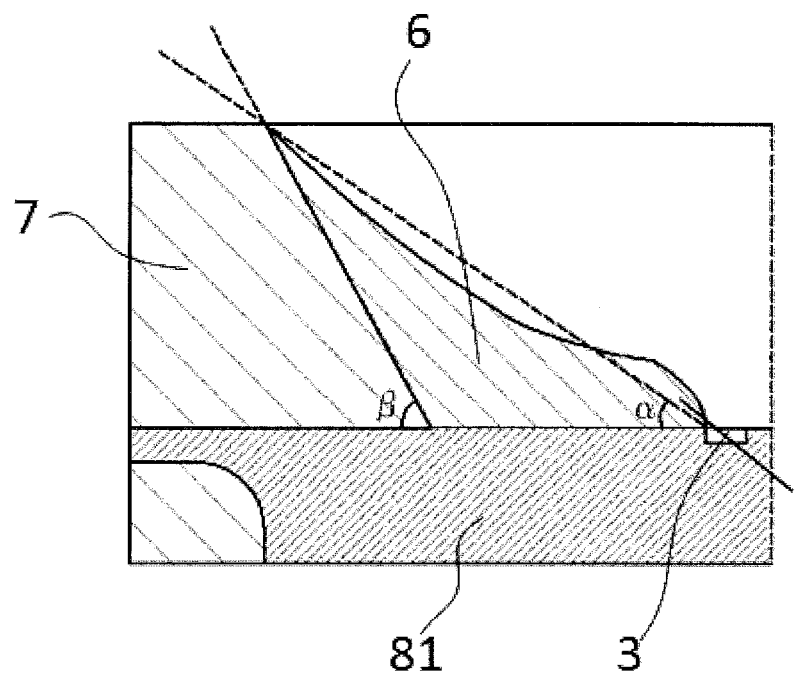
FIG. 4 is a schematic cross-sectional view showing the shape of a light reflecting member according to the embodiment of the present disclosure.

Further, as shown in FIG. 4, the reflecting surface of the light reflecting member 6 is inclined outward from the bottom surface of the recess 2 toward the opening of the recess 2. An inclination angle $\alpha$ defined by a line connecting between an upper end and a lower end of the reflecting surface of the light reflecting member 6 and the bottom surface of the recess 2 is preferably smaller than an inclination angle $\beta$ defined by a line connecting between an upper end and a lower end of a lateral surface of the recess 2 and the bottom surface of the recess 2. With this arrangement, light emitted from the light emitting element 4 and reflected at the light reflecting member 6 can be prevented from returning toward the light emitting element 4, so that light extraction can be improved.

The light reflecting member 6 has a reflectance higher than that of the molded body 7. For example, the light reflecting substance contained in the light reflecting member 6 (e.g., titanium oxide) is greater in amount than the light reflecting substance contained in the molded body 7. The light reflecting substance contained in the light reflecting member 6 is preferably 1.5 times as much as the light reflecting substance contained in the molded body 7 or greater, more preferably twice as much as the light reflecting substance contained in the molded body 7 or greater, and even more preferably 2.5 times as much as the light reflecting substance contained in the molded body 7 or greater. For example, the light reflecting member 6 contains titanium oxide by 40 weight percent.

The light reflecting member 6 preferably has a light reflectance higher than that of the plating layer (e.g., silver plating layer) formed at the plurality of leads 8. The expression "higher in light reflectivity" as used herein refers to that the average value of the light reflectivity of the light reflecting member 6 relative to all the wavelengths of light emitted from the light emitting element 4 is higher than that of the plating layer. Even in the case where the light reflecting member 6 has a reflectance lower than that of the plating layer, covering the wires that absorb light from the light emitting element 4 with the light reflecting member 6 or providing the light reflecting surface of the light reflecting member 6, which is configured to upwardly direct light from the light emitting element 4, to be oriented more upward (i.e., so that inclination angle $\alpha$<inclination angle $\beta$) allows for increasing light extraction, so that a light emitting device with good light extraction efficiency can be obtained.

The light reflecting member 6 covers at least a portion of each of the lateral surfaces of the recess 2 in a cross-sectional view. In particular, as shown in FIG. 1C, the light reflecting member 6 preferably covers an entirety of the lateral surfaces of the recess 2. In other words, the upper end portion of the light reflecting member 6 may be located at the upper end portion of the lateral surfaces of the recess 2. With this arrangement, the lateral surfaces of the recess 2 can be covered with the light reflecting member 6 having a light reflectance greater than that of the molded body 7, so that a light emitting device with good light extraction efficiency can be obtained.

As shown in FIG. 1B, the light reflecting member 6 preferably covers the entirety of the bottom surface of the recess 2 except for the element mounting region X and the groove 3. In particular, the light reflecting member 6 is preferably disposed such that the bonding region of the electrically conductive wires extending from the light emitting element 4 and connected to the plurality of leads 8 and any electronic component such as the protective element are partially or entirely embedded in the light reflecting member 6. With this arrangement, light from the light emitting element 4 can be prevented from being absorbed by the electrically conductive wires, the protective element, or the like. Compared with the case of using the light-transmissive member, using the light reflecting member 6 with a thermal expansion coefficient smaller than that of the light-transmissive member 5 allows for reducing thermal stress applied to the bonding region of each of the wires, at which breakage may easily occur. Thus, a light emitting device can be obtained in which disconnection of wires does not easily occur.

The light reflecting member 6 is preferably made of a material that does not easily transmit or absorb light from the light emitting element 4 or external light. For example, for the base material of the light reflecting member 6, thermosetting resin, thermoplastic resin, or the like can be used. More specifically, examples of the base material include phenolic resin, epoxy resin, BT resin, PPA, silicone resin and the like. A reflecting member (for example, titanium oxide, silicon oxide, zirconium oxide, aluminum oxide, aluminum nitride) or the like that barely absorbs light from the light emitting element 3 and has a large difference in refractive index from a resin serving as the base material, may be contained in such resin serving as the base material as described above, so that light can be efficiently reflected.

For the light reflecting member 6, a resin with good discoloring resistance that is less easily discolored by light or heat than the molded body 7 is preferably used. Because discoloration may easily occur at a portion directly irradiated with heat or light from the light emitting element 3, it is preferable that, for example, a surface of the molded body 7 made of an epoxy-based resin is preferably covered by the light reflecting member 6 made of silicone-based resin with greater discoloration resistance than that of the molded body 7.

The light reflecting member 6 preferably has a high viscosity. For example, the viscosity of the light reflecting member 6 is in a range of 1 Pa·s to 100 Pa·s, and more preferably in a range of 5 Pa·s to 10 Pa·s. With this, at the time of forming the light reflecting member 6, the light reflecting member 6 can be prevented from crossing the groove 3 and reaching the lateral surfaces of the light emitting element 4.

Light Emitting Element

The light emitting element 4 may be a semiconductor light emitting element such as a light emitting diode element. The light emitting element 4 includes an element structure made of various semiconductors, and positive and negative electrodes. In particular, the light emitting element 4 is preferably a nitride semiconductor ($In_xAl_yGa_{1-x-y}N$, $0 \leq x$, $0 \leq y$, $x+y \leq 1$) configured to emit light in the ultraviolet to visible light region. Alternatively, the light emitting element 4 may be a gallium-arsenide-based or gallium-phosphide-based semiconductor to emit green to red light. The light emitting element 4 may include a substrate. The substrate is preferably light-transmissive, but is not limited thereto. For the base material of the substrate, sapphire, gallium nitride, aluminum nitride, silicon, silicon carbide, gallium arsenide or the like can be employed. With the light emitting element 4 in which the positive and negative electrodes are provided on a same surface side, each of the electrodes are connected to respective one of the leads 8 by wires, so that face-up mounted. The number of the light emitting element 4 mounted on one light emitting device may be one or two more. In the case where a plurality of light emitting elements 4 are employed, the light emitting elements are connected in series, in parallel, or in combination thereof by wires. Further, one light emitting device may include, for example, three light emitting elements 4 configured to emit blue light, green light, and red light, respectively. Alternatively, one light emitting device may include two light emitting elements 4 configured to emit blue light and green light, respectively.

Light-Transmissive Member

The light emitting device 100 preferably includes the light-transmissive member 5. The light-transmissive member 5 is disposed at the recess 2 so as to cover the light emitting element 4. The light-transmissive member 5 serves to protect the light emitting element from external force, dust, moisture and the like, and to improve heat resistance, weather resistance, and light resistance of the light emitting element.

Further, the light-transmissive member 5 is preferably disposed so as to be in contact with at least a portion of the inner surface of the groove 3. With this arrangement, even in the case where the light reflecting member 6 is expanded due to heat from the light emitting element 4 toward the lateral surfaces of the light emitting element 4, the light-transmissive member 5 (in particular, a portion of the light-transmissive member 5 at the inner surface of the groove 3) can apply stress in the direction opposite to the stress of the expansion to the light reflecting member 6. Accordingly, the light reflecting member 6 is prevented from covering the lateral surfaces of the light emitting element 4. Further, with the light-transmissive member 5 being in contact with at least a portion of the inner surface of the groove 3, adhesion between the light-transmissive member 5 and the resin package 1 can be improved. The expression "the inner surface of the groove 3" above refers to the entirety of a portion of the surface of the groove 3 surrounded by the outer upper edge P and the inner upper edge Q of the groove 3.

The light-transmissive member 5 preferably transmits 60% and greater, and further preferably 70%, 80% or 90% or greater of light from the light emitting element 4. For the material of the light-transmissive member 5, a resin material employed for the molded body 7 can be used. Examples of the base material include silicone resin, epoxy resin, acrylic resin or a resin including at least one of these resins. The light-transmissive member 5 may be a single layer, or may have a multilayer structure. Further, in the light-transmissive member 5, light scattering particles such as titanium oxide, silicon oxide, zirconium oxide, aluminum oxide may be dispersed.

Further, in the light-transmissive member 5, particles of a material configured to convert the wavelength of light from the light emitting element 4 (e.g., a fluorescent material or the like) may be dispersed. Examples of the fluorescent material include cerium-activated yttrium-aluminum-garnet, cerium-activated lutetium-aluminum-garnet, europium and/or chromium-activated nitrogen-containing calcium aluminosilicate (a part of calcium may be substituted for strontium), europium-activated sialon, europium-activated silicate, europium-activated strontium aluminate, manganese-activated potassium fluorosilicate.

The content of the light scattering particles and/or the fluorescent material is, for example, preferably about 10 to 80 percent by weight to the total weight of the light-transmissive member 5.

2. Second Embodiment

Figure 5A:
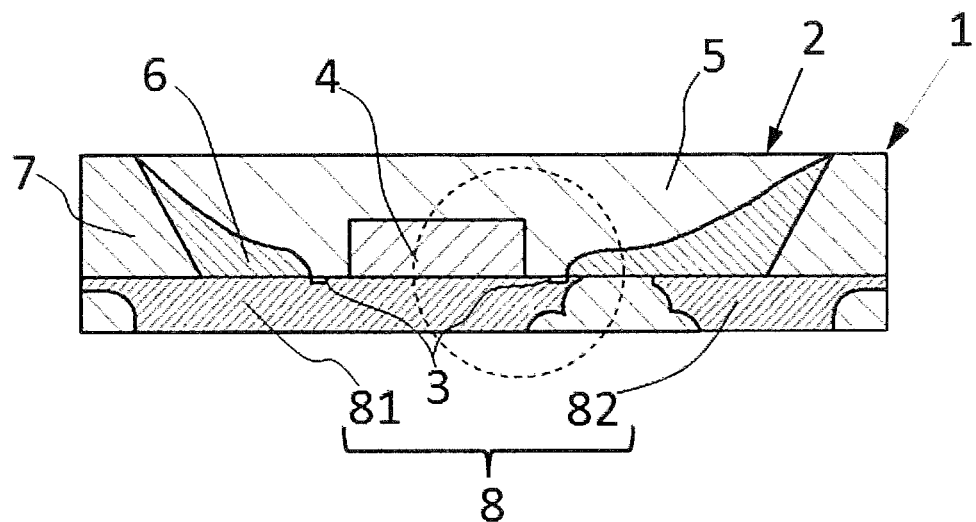
FIG. 5A is a schematic perspective view of a light emitting device 200 according to a second embodiment of the present disclosure.
Figure 5B:
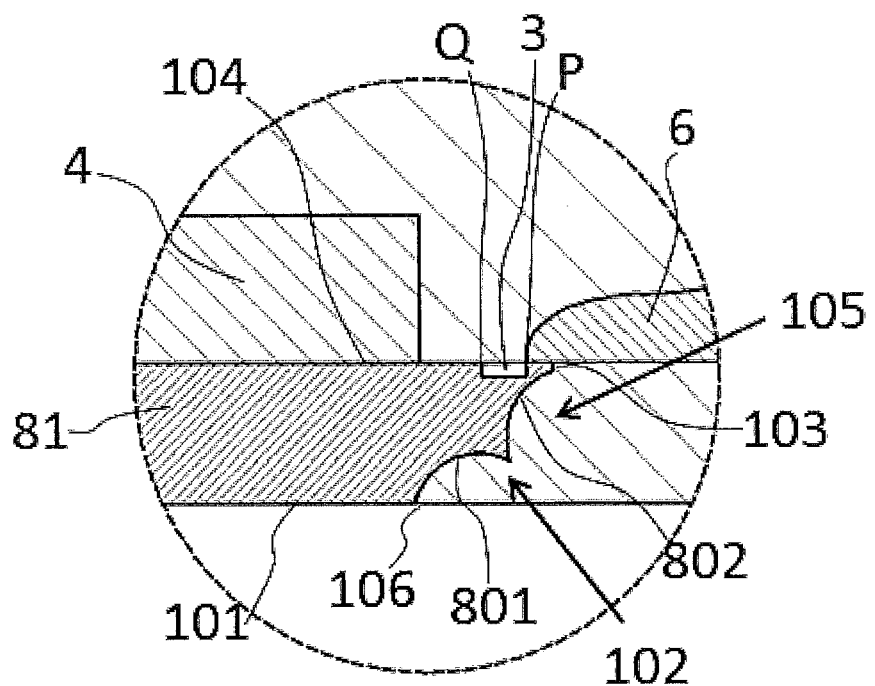
FIG. 5B is an enlarged view of a portion surrounded by a broken line in FIG. 5A.

FIG. 5A is a schematic cross-sectional view showing a light emitting device 200. FIG. 5B is an enlarged view of a portion surrounded by a broken line in FIG. 5A.

The light emitting device 200 shown in FIGS. 5A and 5B is different from the light emitting device 100 according to the first embodiment in that the recessed surface 102 of the first lead 81 includes a first recessed surface portion 801 and a second recessed surface portion 802.

That is, in the light emitting device according to the second embodiment, the recessed surface 102 includes a plurality of recessed surface portions. In the light emitting device 200 shown in FIGS. 5A and 5B, the recessed surface portion 102 includes the first recessed surface portion 801 and the second recessed surface portion 802. The first recessed surface portion 801 is continuous to the lower surface 101 of the first lead 81. The second recessed surface portion 802 is continuous to the first recessed surface portion 801. With the first recessed surface 801 and the second recessed surface 802, the surface area of the end portion 105 of the first lead 81 can be increased, which allows for easily preventing leakage of components of the light-transmissive member 5 and the like and entry of solder flux. Further, adhesion between the pair of leads 8 and the molded body 7 can be improved.

The shape of the first recessed surface 801 and the second recessed surface 802 may be selected according to the characteristics, shape, positional relationship or the like of the mask in the etching processing of the lead frame. Further, while the recessed surface of each of the first recessed surface 801 and the second recessed surface 802 is preferably made of a curved surface, it may be a combination of a flat surface and a curved surface, or may have irregularities.

Further, while the recessed surface 102 is made of two recessed surface portions in the light emitting device 200 shown in FIGS. 5A and 5B, any appropriate structure can be employed, and the recessed surface 102 may have three or more recessed surface portions. Further, while the light emitting device 100 and the light emitting device 200 respectively shown in FIG. 1D and FIG. 5B each have the lateral surface 103 on the end portion 105 side of the first lead 81, a recessed surface may be formed at the entirety of the end portion of the first lead 81 between the upper surface 104 and the lower surface 101 of the first lead 81.

As shown in the above, certain embodiments are illustrated, but the scope of the present invention is not limited to the above description.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
a resin package having a package bottom surface and a package top surface opposite to the package bottom surface in a height direction of the resin package, the resin package having a recess hollowed from the package top surface in the height direction, the recess being defined by a recess bottom surface and a recess lateral surface, the resin package comprising:
   a first lead provided on the recess bottom surface and comprising:
      a first lead lower surface opposite to the recess bottom surface in the height direction;
      a first lead upper surface opposite to the first lead lower surface in the height direction, the first lead upper surface constituting a first part of the recess bottom surface;
      an end portion connecting the first lead lower surface and the first lead upper surface; and
      a groove provided on the first lead upper surface;
   a main body supporting the first lead;
a light emitting element mounted on the first lead upper surface, the groove being provided between the light emitting element and the recess lateral surface to surround the light emitting element; and
a light reflecting member disposed on the recess bottom surface between the recess lateral surface and the groove in a lateral direction perpendicular to the height direction not to cover the groove, the end portion being provided between the first lead lower surface and the light reflecting member in the lateral direction, the end portion having a cross-sectional area viewed in the lateral direction which is smaller than a cross-sectional area of the first lead between the first lead lower surface and the first lead upper surface viewed in the lateral direction.

2. The light emitting device according to claim 1, wherein the end portion comprises
   a recessed surface connected to the first lead lower surface and curved toward the recess bottom surface, and
   a lateral surface connected to the first lead upper surface, the lateral surface being closer to the groove in the lateral direction than to a boundary between the first lead lower surface and the recessed surface, the lateral surface having a depth in the height direction which is shorter than a distance between the first lead lower surface and the first lead upper surface in the height direction.

3. The light emitting device according to claim 2, wherein the light reflecting member is in contact with the first lead between the lateral surface and the groove.

4. The light emitting device according to claim 2, wherein the groove includes an inner outer upper edge and an outer upper edge closer to the lateral surface than the inner outer upper edge.

5. The light emitting device according to claim 1, wherein the resin package further comprises a second lead provided on the recess bottom surface to oppose the end portion of the first lead in the lateral direction, the second lead including a second lead upper surface constituting a second part of the recess bottom surface.

6. The light emitting device according to claim 5, wherein the main body, the first lead, and the second lead are integrated into a single body.

7. The light emitting device according to claim 2, wherein the groove is located at a position higher than the boundary between the first lead lower surface and the recessed surface in the height direction.

8. The light emitting device according to claim 1, wherein a planar distance between the lateral surface and the boundary between the first lead lower surface and the recessed surface is in a range of 10 µm to 30 µm in the lateral direction.

9. The light emitting device according to claim 1, further comprising a light-transmissive member, wherein a portion of the light-transmissive member is in contact with an inner surface of the groove.

10. The light emitting device according to claim 1, wherein the light reflecting member has a light reflectance higher than the main body.

11. The light emitting device according to claim 4, wherein an end of the light reflecting member in the lateral direction is positioned in vicinity of the outer upper edge of the groove.

12. The light emitting device according to claim 1, wherein the recess bottom surface is plane.

13. The light emitting device according to claim 1, further comprising:
   an additional light emitting element mounted on the first lead upper surface, wherein
   the additional light emitting element is offset from the light emitting element in the lateral direction and/or in another lateral direction perpendicular to the lateral direction and the height direction.

14. The light emitting device according to claim 1, wherein the light reflecting member is disposed not to cover an entirety of the groove.

15. The light emitting device according to claim 1, wherein the light reflecting member has a light reflectance higher than resin of the resin package.

16. The light emitting device according to claim 15, wherein a light reflective substance contained in the light reflecting member is greater in amount than the light reflective substance contained in the resin of the resin package.

17. The light emitting device according to claim 1, wherein the light reflecting member is disposed to cover a part of the groove.

18. The light emitting device according to claim 1, further comprising:
   a protective layer provided on the first lead upper surface.

* * * * *